United States Patent [19]
Yang et al.

[11] Patent Number: 5,804,489
[45] Date of Patent: Sep. 8, 1998

[54] METHOD OF MANUFACTURING A CROWN SHAPE CAPACITOR IN SEMICONDUCTOR MEMORY USING A SINGLE STEP ETCHING

[75] Inventors: Fu-Liang Yang, Tainan; Erik S. Jeng, Taipei; Yu-Chun Ho, Pan-Chiao; Bin Liu, Taipei; Chao-Ming Koh, Shung-Hsi, all of Taiwan

[73] Assignee: Vanguard International Semiconductor Corporation, Hsinchu, Taiwan

[21] Appl. No.: 679,196

[22] Filed: Jul. 12, 1996

[51] Int. Cl.⁶ ................................................ H01L 21/8242
[52] U.S. Cl. ............................................ 438/396; 438/398
[58] Field of Search ...................................... 438/396, 398

[56] References Cited

U.S. PATENT DOCUMENTS

| | | |
|---|---|---|
| 4,225,945 | 9/1980 | Kuo . |
| 4,457,063 | 7/1984 | Park .................................... 438/397 |
| 5,342,800 | 8/1994 | Jun ...................................... 438/396 |
| 5,374,580 | 12/1994 | Baglee et al. . |
| 5,543,345 | 8/1996 | Liaw et al. ........................... 438/397 |
| 5,668,038 | 9/1997 | Huang et al. ........................ 438/396 |

*Primary Examiner*—Chandra Chaudhari
*Assistant Examiner*—Craig Thompson
*Attorney, Agent, or Firm*—Christensen, O'Connor, Johnson & Kindness PLLC

[57] ABSTRACT

The present invention is a method of manufacturing crown shape capacitors in the semiconducter memories. Using a single step etching to farbricate the capacitor in a DRAM cell. The method can form side wall polymers and etching byproductions on the surface of the first polysilicon, using the side wall polymers and the etching byproductions as a mask to form the crown shape capacitors with pillars. Moreover, this present invention can form the crown shape structure and pillars in the same step, the crown shape structure and the pillars increase the surface area of the capacitor. Therefore the present invention will increase the performance of the capacitor.

8 Claims, 3 Drawing Sheets

METHOD OF MANUFACTURING A CROWN SHAPE CAPACITOR IN SEMICONDUCTOR MEMORY USING A SINGLE STEP ETCHING

BACKGROUND OF THE INVENTION

1. Field of the Invention

The present invention relates to semiconductor capacitors, and more specifically, to a high capacitance memory cell capacitor and a method of manufacturing the same.

2. Description of the Prior Art

Great progress has been made in the manufacture of Dynamic Random Access Memory (DRAM) using high density integrated circuit technology. The industry has progressed from DRAMs of 16 Kbits capacity to DRAMs of up to 64 Mbits capacity.

A memory cell for each bit in semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture.

However, in order to achieve high performance (i.e. high density), memory cells in DRAM technology must be scaled down to the submicrometer range. Thus, as the capacity of DRAMs has increased, the size of the memory cells must steadily decrease. For very small memory cells, planar capacitors become very difficult to use reliably. Specifically, as the size of the capacitor decreases, then the capacitance of the capacitor also decreases. Similarly, the size of the charge capable of being stored by the capacitor decreases. This results in the capacitor being very susceptible to α particle interference. Additionally, as the capacitance decreases, the charge held by storge capacitor must be refreshed often.

Prior art approaches to overcoming these problems have resulted in the development of the trench capacitor (see U.S. Pat. No. 5,374,580) and the stacked capacitor. The trench capacitor has the well-known problem of "gated diode leakage," which is the leakage of current resulting in the trench capacitor failing to hold a charge. The stacked capacitor suffers from the problem of high manufacturing complexity.

Another way to increase the capacitance per unit area is to etch a groove in the capacitor terminal, thus increasing the area of the capacitor. See, for example, U.S. Pat. No. 4,225,945 and U.S. Pat. No. 5,374,580. Reducing the thickness of the dielectric also can improve the capacitance of the capacitor, but this approach is limited because of yield and reliability problems.

The present invention provides a DRAM capacitor which provides high storage capacitance per unit of semiconductor surface.

SUMMARY OF THE INVENTION

The present invention is a method of manufacturing crown shape capacitors in the semiconducter memories. Using a single step etching to farbricate the capacitor in a DRAM cell instead of the conventional method which needs two etching steps and one step to removed the photoresist. This method comprizes the steps of forming a first polysilicon layer on a semiconductor substrate, then pattering and defining a photoresist on the first polysilicon layer. Next the first polysilicon layer and the photoresist are dry-etched. During the dry-etching step, there are formed side wall polymers and etching byproduction on the surface of the first polysilicon, using the side wall polymers and the etching byproductions as a mask to form the crown shape capacitors with pillars, followed by depositing a dielectric layer and the second polysilicon layer. Moreover, this invention forms the crown shape structure and pillars in a single etching step, the crown shape structure and the pillars increase the surface area of the capacitor. Therefore the present invention will increase the performance of the capacitor.

DESCRIPTION OF THE PREFERRED EMBODIMENT

The formation of the crown capacitor described herein includes the process of photolithographic masking and etching. This process consists of creating a photolithographic mask containing the pattern of the component to be formed, coating the wafer with a light sensitive material called a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithographic masking and etching process is referred to as "patterning and etching".

Figure 1:
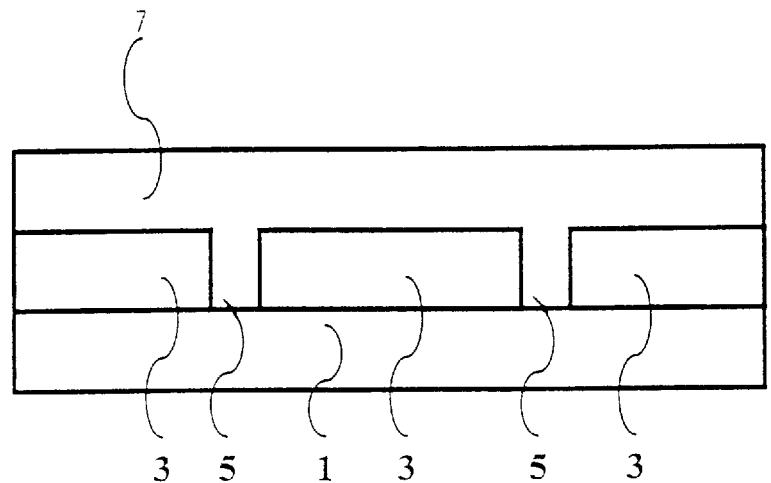
FIGS. 1–7 are cross-section views of a semiconductor wafer illustrating the steps in the manufacture of crown shape capacitors having pillars in accordance with the present invention.

Referring to FIG. 1, a single crystal substrate 1 is P-type with a <100> crystallographic orientation. Field oxide (FOX) regions are created for purposes of isolating the adjacent structures. Generally, the FOX regions are created using well known photolithography and dry etching steps. In the preferred embodiment, first a silicon nitride-silicon dioxide composite layer is deposited onto the substrate 1. A photoresist is then applied to the composite layer that delineates the desired FOX regions. After the photoresist is removed, the substrate is wet cleaned. Next, thermal oxidation in an oxygen steam environment is used to form FOX. Preferably, FOX has a thickness of about 4000–6000 angstroms.

Next, typically a gate electrode is formed in substrate 1. Source and drain impurity regions are also formed under contact holes 5. The formation of the access transistors for DRAMs is well known in the art and is not particularly germane to the present invention. Thus, only a cursory description of the transistors is given here. One example is seen in U.S. Pat. No. 5,489,791 to Arima et al. Then a dielectric layer 3 is formed on the substrate. Next, contact holes 5 are formed by using etching process.

The first polysilicon layer 7 is formed over the contact holes 5 and the dielectric layer. The first polysilicon layer 7 is formed using low pressure chemical vapor deposition (LPCVD). It can be appreciated that other methods of depositing the first polysilicon layer 7 can also be used. The thickness of the first polysilicon layer 7 is optimally between about 2000 to 10000 angstroms. The first polysilicon layer 7 is chosen from doped polysilicon or in-situ doped polysilicon or undoped polysilicon.

Figure 2:
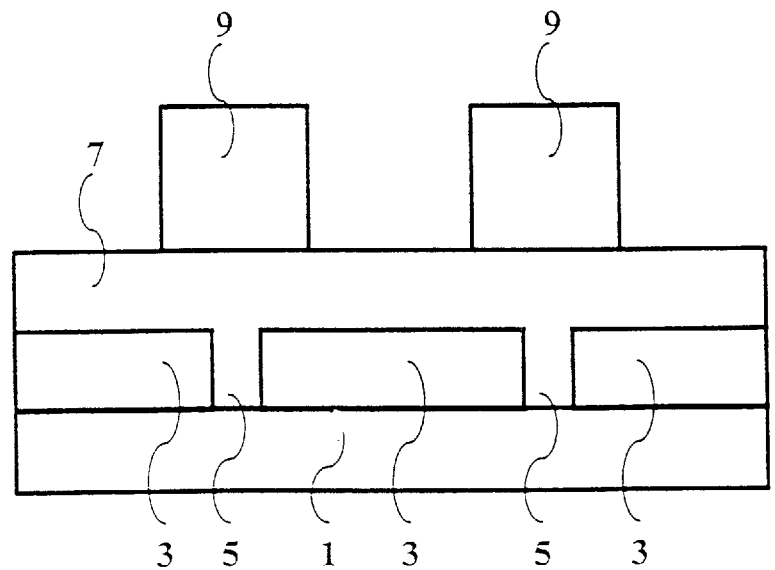

Turning next to FIG. 2, a photoresist 9 is formed on the first polysilicon layer 7. The photoresist 9 is aligned approximately above each of the contact holes 5.

Figure 3:
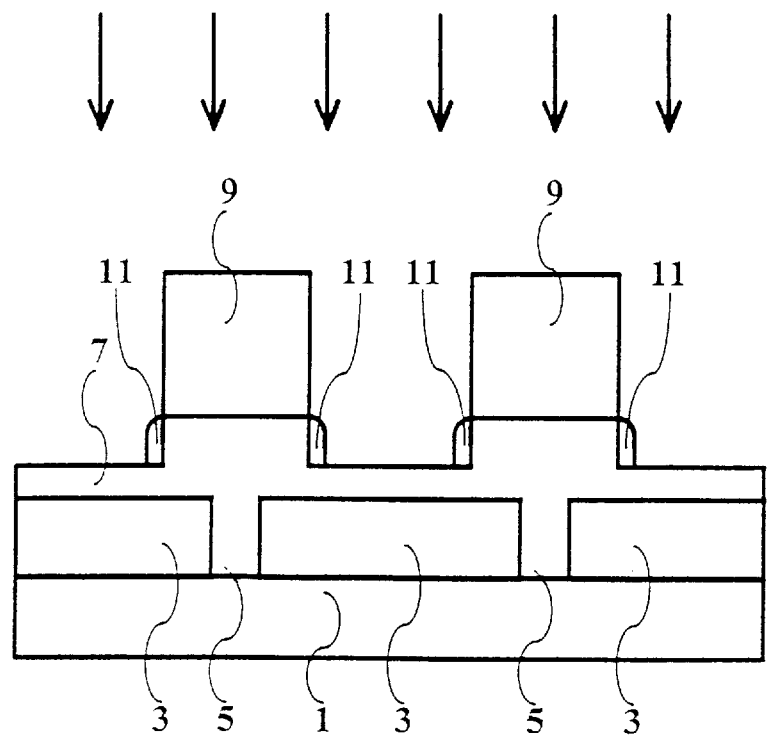

Turning next to FIG. 3, dry etching is used to form the bottom storage electrode of the capacitor. One key of the present invention is that the single dry etching step completely forms a crown shaped structure for use as a capacitor electrode. The first polysilicon layer 7 and the photoresist 9 are anisotropically etched by dry etching, using an electron cyclotron resonance (ECR) process, reactive ion etching or other processes of plasma etching. The dry etching has two portions: a main etching portion and an over etching portion. The main etching portion is used to etch the photoresist 9 and the first polysilicon layer 7 region that is not covered by the photoresist 9. The main etching portion is performed with a pressure of 1–700 mtorr, with a $Cl_2, HBr, SF_6, CH_2F_6, CHF_3, CF_4$ reaction gas. During the main etching portion, there are polymers 11 created on the sidewall of the first polysilicon layer 7. Specifically, it has been found that the combination of the etching gas, the photoresist 9, and the polysilicon react to form polymers 13.

Figure 4:
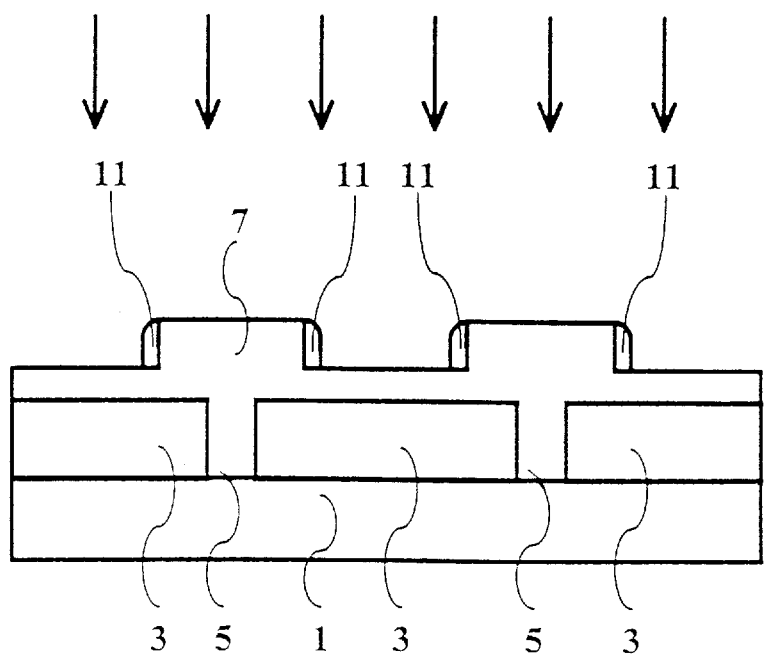

During the etching process, the unmasked portions of first polysilicon layer 7 is removed, as shown in FIG. 3. The main etching portion finishes when photoresist 9 is removed to the boundary of the first polysilicon layer 7, as shown in FIG. 4. Further, during the main etching portion, sputtering of polymers takes place onto the top surface of the first polysilicon layer 7. The sputtering is random and results in byproducts 13 on the surface of first polysilicon layer 7.

Figure 5:
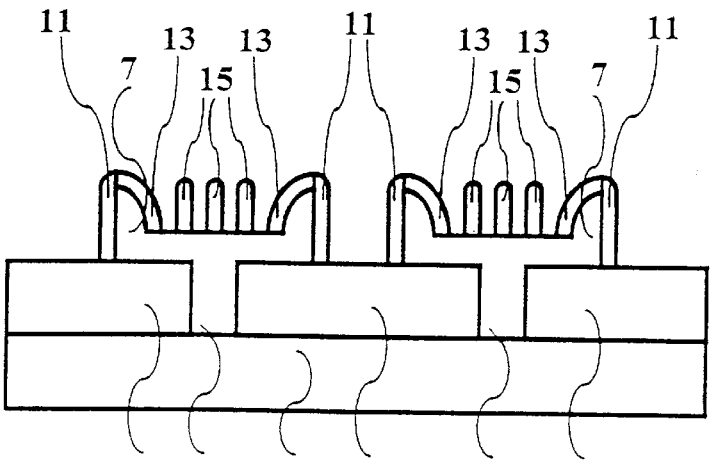

As shown in FIGS. 4 and 5, the over etching portion is performed to form the bottom storage electrode of the capacitor. The same ECR or other plasma etching process is used to etch back the first polysilicon layer 7 to form a cavity in first polysilicon layer 7. Because of the byproducts 13, the over etching portion leaves masked portions of the top surface of the first polysilicon layer 7. In addition, further byproducts 14 are generated on the inner sidewalls of the first polysilicon layer 7. During the over etching portion, therefore, pillars 15 are formed under the byproducts 13.

As shown in FIG. 5, the side wall polymers 11, the etching byproducts 13 and the inner side wall byproducts 14 serve as a mask. As a result, the first polysilicon layer 7 is etched to form a cavity which may have several pillars 15 randomly located within the cavity.

Figure 6:
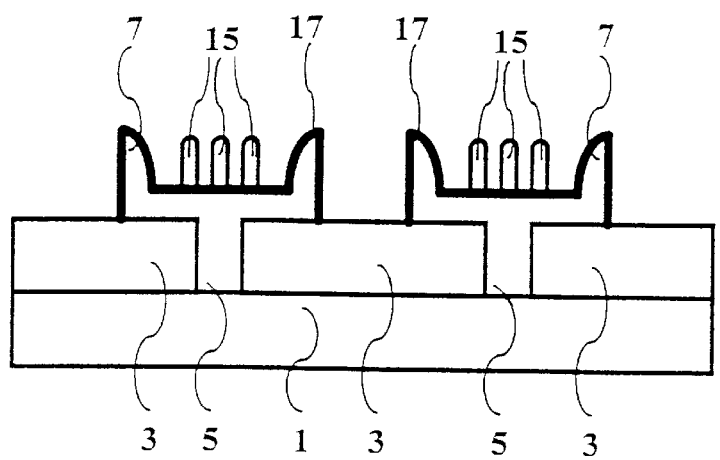

As shown in FIG. 6, the next step is the removal of the side wall polymers 11 and etching byproducts 13, leaving the first polysilicon layer 7 in a crown shape having pillars 15 randomly located within the cavity. The crown shaped first polysilicon layer 7 is then used as a bottom storage electrode.

As shown in FIG. 6, the next step is the deposition of a dielectric film 17 along the surface of the storage electrode 7. The dielectric film 17 is preferably formed of either a double film of nitride/oxide film, a triple film of oxide/nitride/oxide, or any other high dielectric film such as tantalum oxide($Ta_2O_5$).

Figure 7:
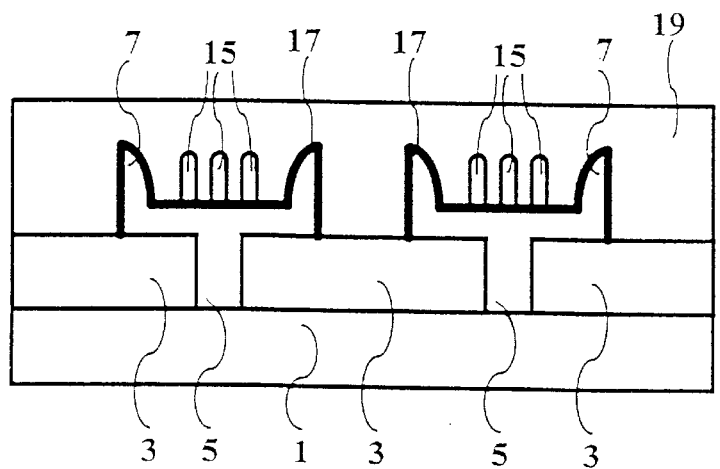

As shown in FIG. 7, a second polysilicon layer 19 deposited using a conventional LPCVD process over the dielectric film 17. The second polysilicon layer 19 is used as the top storage electrode and is formed of doped polysilicon or in-situ doped polysilicon. Thus, a semiconducter capacitor comprising the first polysilicon layer 7, a dielectric 17, and a second polysilicon layer 19 forms a crown shaped capacitor.

The present invention thus provides capacitors with enlarged surface areas and a crown shape structure having pillars within the cavity. The present invention uses a single step etching process to fabricate the capacitor in a DRAM cell, instead of the conventional method which needs two etching steps and one step to remove the photoresist. Moreover, the crown shape structure and the pillars can increase the surface area of the capacitor. Therefore the present invention can increase the performance of the capacitor.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an integrated circuit capacitor, the method comprising the steps of:

forming a first polysilicon layer on a semiconductor substrate;

forming a photoresist mask pattern on said first polysilicon layer;

performing a dry etching step to etch said photoresist mask pattern and said first polysilicon layer, said dry etching step including a main etching portion and an over etching portion, wherein said main etching portion includes etching said photoresist mask pattern and said first polysilicon layer that is not covered by said photoresist mask pattern, thereby generating polymers on the sidewalls of said first polysilicon layer, further such that byproducts are randomly generated on a top surface of said first polysilicon layer during said main etching portion when said photoresist mask pattern is removed to the boundary of said first polysilicon layer, wherein said overetching portion includes etching back said first polysilicon layer and forming inner sidewall byproducts on the inner sidewalls of said first polysilicon layer, said byproducts and said inner sidewall byproducts used as a mask;

removing said polymers, said byproducts and said inner sidewall byproducts; forming a dielectric film on the surface of said first polysilicon layer; and forming a second polysilicon layer over said dielectric film.

2. The method of claim 1, wherein the step of forming said first polysilicon layer on said substrate comprises forming said polysilicon layer on a dielectric layer formed on said substrate, said polysilicon layer contacting said substrate through contact holes in said dielectric layer.

3. The method of claim 1, wherein said first polysilicon layer has a thickness of a range between 2000 to 10000 angstroms.

4. The method of claim 1, wherein said step of dry etching is an electron cyclotron resonance (ECR) process, reactive ion etching or plasma etching.

5. A method of forming a polysilicon pillar comprising the steps of:

forming a polysilicon layer;

patterning a photoresist on said polysilicon layer; and performing a dry etching step to etch said photoresist and said first polysilicon layer, said dry etching step including a main etching portion and an overetching portion, wherein said main etching portion includes etching said photoresist and said first polysilicon layer that is not covered by said photoresist, thereby generating polymers on the sidewalls of said first polysilicon layer, further thereby generating byproducts randomly on a top surface of said first polysilicon layer during said main etching portion when said photoresist is removed to the boundary of said first polysilicon layer, wherein said overetching portion includes etching back said first polysilicon layer and forming inner sidewall byproducts on the inner sidewalls of said first polysilicon layer, said byproducts and said inner sidewall byproducts used as a mask.

6. The method of claim 4, wherein the reaction gas of said dry etching is selected from a group consisting of $Cl_2$, HBr, $SF_6$, $C_2F_6$, $CHF_3$ and $CF_4$.

7. The method of claim 5, wherein the reaction gas of said dry etching is selected from a group consisting of $Cl_2$, HBr, $SF_6$, $C_2F_6$, $CHF_3$ and $CF_4$.

8. A method for manufacturing an integrated circuit capacitor, the method comprising the steps of:

forming a first polysilicon layer on a semiconductor substrate;

forming a photoresist mask pattern on said first polysilicon layer;

performing a dry etching step to etch said photoresist mask pattern and said first polysilicon layer, wherein the reaction gas of said dry etching is selected from a group consisting of $Cl_2$, HBr, $SF_6$, $C_2F_6$, $CHF_3$ and $CF_4$, said dry etching step including a main etching portion and an overetching portion, wherein said main etching portion includes etching said photoresist mask pattern and said first polysilicon layer that is not covered by said photoresist mask pattern, thereby generating polymers on the sidewalls of said first polysilicon layer, further thereby generating byproducts on a top surface of said first polysilicon layer during said main etching portion when said photoresist mask pattern is removed to the boundary of said first polysilicon layer, wherein said overetching portion includes etching back said first polysilicon layer and forming inner sidewall byproducts on the innerside walls of said first polysilicon layer, thereby generating a polysilicon crown shaped structure having pillars formed therein under said byproducts and said polymers, said byproducts and said inner sidewall byproducts as a mask;

removing said polymers, said byproducts and said inner sidewall byproducts;

forming a dielectric film on the surface of said polysilicon crown structure and said pillars; and forming a second polysilicon layer over said dielectric film.

* * * * *